(12) United States Patent
Ko et al.

(10) Patent No.: US 8,413,018 B2
(45) Date of Patent: Apr. 2, 2013

(54) SEPARATE MEMORIES AND ADDRESS BUSSES TO STORE DATA AND SIGNATURE

(75) Inventors: Kung-Ling Ko, Union City, CA (US); Surya Prakash Varanasi, Dublin, CA (US); Subbarao Palacharla, Portland, OR (US)

(73) Assignee: Brocade Communications Systems, Inc., San Jose, CA (US)

( * ) Notice: Subject to any disclaimer, the term of this patent is extended or adjusted under 35 U.S.C. 154(b) by 880 days.

(21) Appl. No.: 12/542,583

(22) Filed: Aug. 17, 2009

(65) Prior Publication Data

US 2011/0041031 A1    Feb. 17, 2011

(51) Int. Cl.
*H03M 13/00*    (2006.01)
(52) U.S. Cl. ........................................................ 714/768
(58) Field of Classification Search ............... 714/42, 714/47.1, 48, 51, 57, 758, 763, 766–769, 714/773
See application file for complete search history.

(56) References Cited

U.S. PATENT DOCUMENTS

| | | | | |
|---|---|---|---|---|
| 6,101,624 A * | 8/2000 | Cheng et al. | ................... | 714/736 |
| 6,560,743 B2 * | 5/2003 | Plants | ........................... | 714/763 |
| 6,581,173 B2 * | 6/2003 | Poisner | ......................... | 714/718 |
| 6,968,478 B1 * | 11/2005 | Edwards et al. | ................. | 714/32 |
| 7,325,178 B2 * | 1/2008 | Damodaran et al. | .......... | 714/718 |
| 7,543,216 B1 * | 6/2009 | Plants | ........................... | 714/763 |
| 7,865,784 B1 * | 1/2011 | White et al. | .................... | 714/53 |
| 2007/0198892 A1 * | 8/2007 | Ng et al. | ........................ | 714/763 |
| 2008/0250297 A1 | 10/2008 | Chung et al. | | |
| 2011/0041030 A1 | 2/2011 | Ko et al. | | |

OTHER PUBLICATIONS

Office Action Summary from U.S. Appl. No. 12/542,575 dated Jan. 12, 2012.

* cited by examiner

*Primary Examiner* — Nedeem Iqbal
(74) *Attorney, Agent, or Firm* — Wong, Cabello, Lutsch, Rutherford & Brucculeri, LLP

(57) ABSTRACT

A programmable device employs an address and data corruption logic for data written to a first memory. A first signature is computed from the data stored in the first memory and stored in a second memory. When data is read from the first memory, the first signature stored in the second memory is read and compared with a second signature computed from the data read from the first memory. If the first and second signatures do not match, an error condition is indicated.

19 Claims, 6 Drawing Sheets

SEPARATE MEMORIES AND ADDRESS BUSSES TO STORE DATA AND SIGNATURE

TECHNICAL FIELD

The present invention relates to the field of computer and networking hardware, and in particular to a technique for detecting address corruption during memory transfer operations.

BACKGROUND ART

In modern high-speed computer and networking systems, memory is running at such a high speed, with hundreds of millions of accesses per second in some systems, that not only data stored in memory can get corrupted during memory accesses, but address information can also get corrupted. Conventional systems address the data errors by providing Error Correction Code (ECC) protection of the data by including ECC logic in the controller and additional data storage on the memory module, such as a DIMM, but the ECC logic does not protect against address information corruption detection.

SUMMARY OF INVENTION

According to one embodiment; a device comprises a first memory, a second memory, a core logic unit, coupled to the first memory via a first address line and coupled to the second memory via a second address line, wherein the core logic unit is programmed to read from and write to the first and second memories, a first signature generator logic, configured to compute a first signature from data written to the first memory, coupled to the second memory to store the first signature in the first memory, a second signature generator logic, configured to compute a second signature from data read from the first memory, and a comparator logic, coupled to the second memory and the second signature generator logic, indicating an error condition to the core logic unit if the first signature does not match the second signature.

According to a another embodiment; a method comprises comparing a first signature computed from data written to a first memory using a first address line with a second signature computed from data read from the first memory, and storing the first signature in a second memory using a second address line.

According to yet another embodiment, a device comprises a first memory and a field programmable gate array (FPGA), coupled to the first memory using a first address line, the FPGA comprising a second memory, internal to the FPGA, addressed using a second address line, and logic to perform the acts of comparing a first signature computed from data written to the first memory with a second signature computed from data read from the first memory and storing the first signature in the second memory.

BRIEF DESCRIPTION OF DRAWINGS

The accompanying drawings, which are incorporated in and constitute a part of this specification, illustrate an implementation of apparatus and methods consistent with the present invention and, together with the detailed description, serve to explain advantages and principles consistent with the invention. In the drawings.

The figures depict embodiments of the present invention for purposes of illustration only. One skilled in the art will readily recognize from the following discussion that alternative embodiments of the structures and methods illustrated herein may be employed without departing from the principles of the invention described herein.

DESCRIPTION OF EMBODIMENTS

Figure 1:
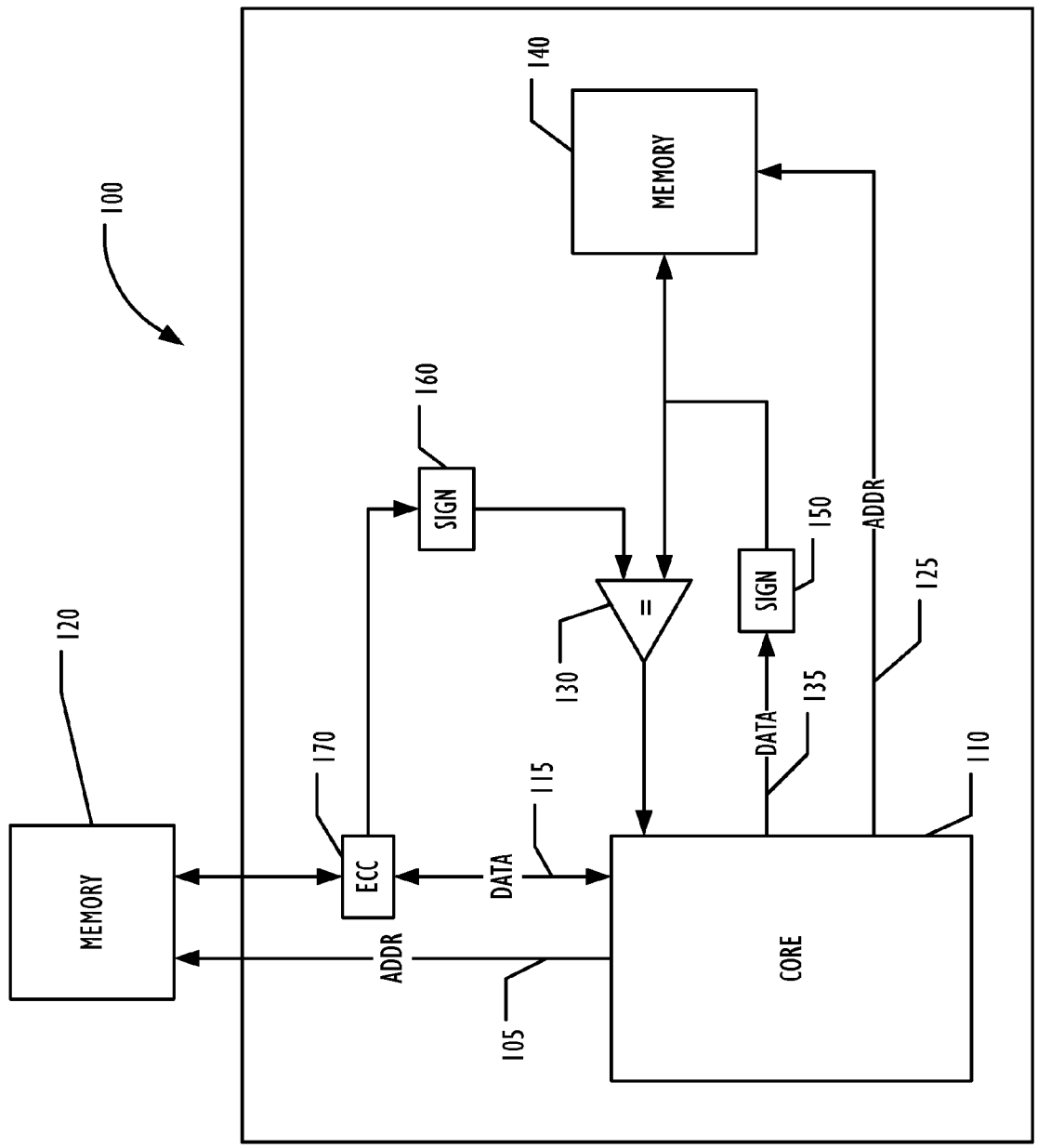
FIG. 1 is a block diagram illustrating a circuit according to one embodiment.

FIG. 1 is a block diagram illustrating a programmable device 100 according to one embodiment, which reads and writes to memory 120. A core logic 110 provides processing capability for the programmable device 100. Although as illustrated in FIG. 1 the memory 120 is external to the programmable device 100 and the memory 140 is internal, either or both of the memories 120, 140 may be either external or internal to the programmable device 100. The illustrated circuits of the programmable device 100 can be implemented as a single chip or multiple chips. Additional elements, such as buffers or other conventional elements of memory-related circuits, may be present in implementations according to this embodiment, but are omitted from FIG. 1 for clarity.

Core logic 110 is connected via first address lines 105 to external memory 120. Second address lines 125 connect the core logic 110 to internal memory 140. The core logic 110 is connected via data lines 115 to Error Correction Code (ECC) generation and checking logic 170 and thence to memory 120. Core logic 110 is further connected via data lines 135 to a signature generation logic 150 and thence to memory 140. Thus, when writing to memory 120, data are transferred via address and data lines 105, 115 to memory 120, and a signature of the data is transferred to memory 140 using address and data lines 125, 135. Any desired signature generation technique can by employed by signature generation logic 150. Although illustrated in FIG. 1 as two separate data lines 115, 135, the data lines 115, 135 may be combined into a single data line if desired.

Data read from memory 120 based on address lines 105 are transferred via the ECC logic 170 back to the core logic 110 over data lines 105, but are also transferred to signature generation logic 160 and thence to comparator 130. Memory 140 is also read based on address lines 125, reading the stored signature to the comparator 130. The comparator 130 compares the signature of the data read from memory 120 and the signature of the data written to memory 120 that was stored in memory 140, passing the result on to the core logic 110. If the signatures do not match, the comparator 130 indicates an error condition to the core logic 110, which may take any desired error action in response to the error indication. In one embodiment, the same address is used on both address lines 105, 125 for reading and writing memories 120, 140.

The use of first and second address lines 105 and 125 increase the likelihood of detection of an addressing error as the chance of identically corrupting both address lines 105 and 125 is very small as the address lines 105 and 125 have different paths or layouts for a large amount of their lengths. This is of course true where the memory 120 is a separate module and the memory 140 is onboard the programmable device but also will be true for cases where both memories 120 and 140 are onboard or external. This different path or layout differs from the address bus arrangement used with DIMMs and other memory modules with ECC capabilities, where the address bus is identical until only the last very short portion contained on the DIMM or the like. The address bus portions used to reach the DIMM are the portions most likely to be the locations of any corruption, not the portion on the DIMM itself.

Although described as address lines 105, 125 and data lines 115, 135, the nature of the connections between the core logic 110 and the memories 120, 140 is outside of the scope of the present invention, and any desired technique for transmitting information to and receiving information from the memories 120, 140 may be used. Memories 120, 140 may be any desired type of addressable memory, including volatile storage devices, such as RLDRAM® memories (RLDRAM is a registered trademark of Infineon Technologies AG), and non-volatile storage devices, and the memories 120, 140 do not need to be identical or of the same type or capacity.

In one embodiment, the programmable device 100 may be implemented as part of a secure logic, packaged in a tamper-resistant packaging, for an encryption device such as an encryption switch for a Storage Area Network (SAN). But the programmable device 100 may be any programmable device that reads or writes to an addressable memory.

FIG. 1 illustrates the use of ECC logic 170 to detect and/or correct data errors. Nevertheless, the use of ECC logic 170 would not detect corruption of the address information when addressing either memory 120 or 140. ECC 170 may be omitted.

Figure 2:
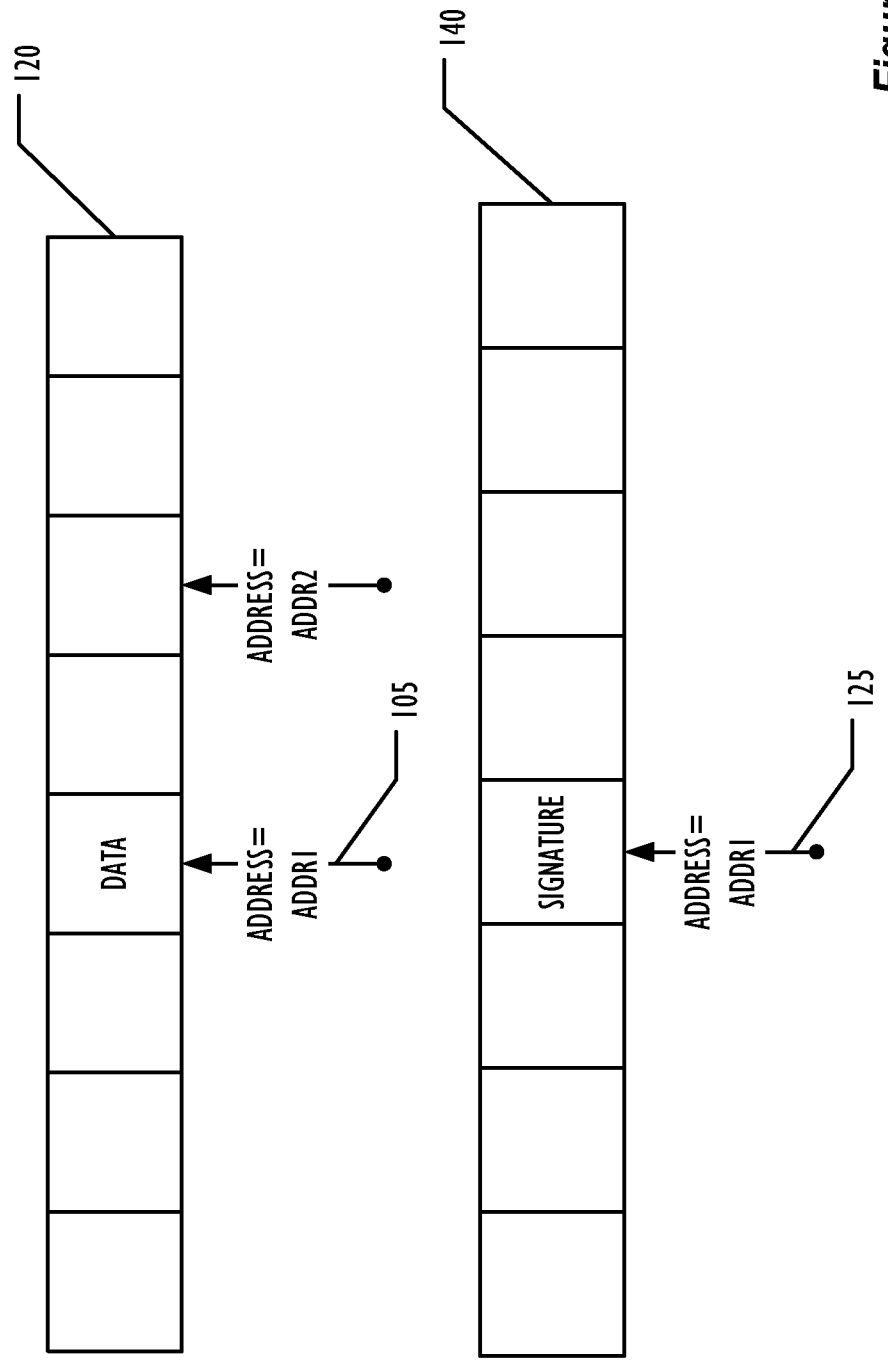
FIG. 2 is a block diagram illustrating two memories according to one embodiment.

FIG. 2 is a block diagram illustrating a technique for writing to memories 120 and 140 according the embodiment of FIG. 1. The core logic 110 writes data to memory 120 at address addr1 using address and data lines 105, 115. The signature generation logic 150 also computes a signature of the data written to address addr1 and writes the signature to memory 140 at the same address, addr1, using address and data lines 125, 135. When reading the data back from memory 120, a new signature is computed signature logic 160 for the data read from memory 120, and compared with the signature read from memory 140 by the comparator 130. If the signatures match, then the data was successfully written and read; otherwise, the comparator 130 indicates an error indication to the core logic 110, which may take an error action. The nature of the error action is outside the scope of the present invention, and will not be discussed further herein.

If there is a corruption of the address when reading from memory 120, for example, if the data is read from the memory 120 at address addr2 instead of address addr1, then the signature computed on that data is unlikely to match the signature stored at address addr1 in memory 140. Similarly, if the data read from address addr1 of memory 120 is corrupted, then the signature computed on that data is unlikely to match the signature stored at address addr1 in memory 140. Therefore, the described technique can detect not just data corruption, but address corruption. Such corruption may arise either during the time the data is stored in the memory 120, or because of corruption on the address lines 105 or data lines 115 while writing or reading the data to the memory 120.

Figure 3:
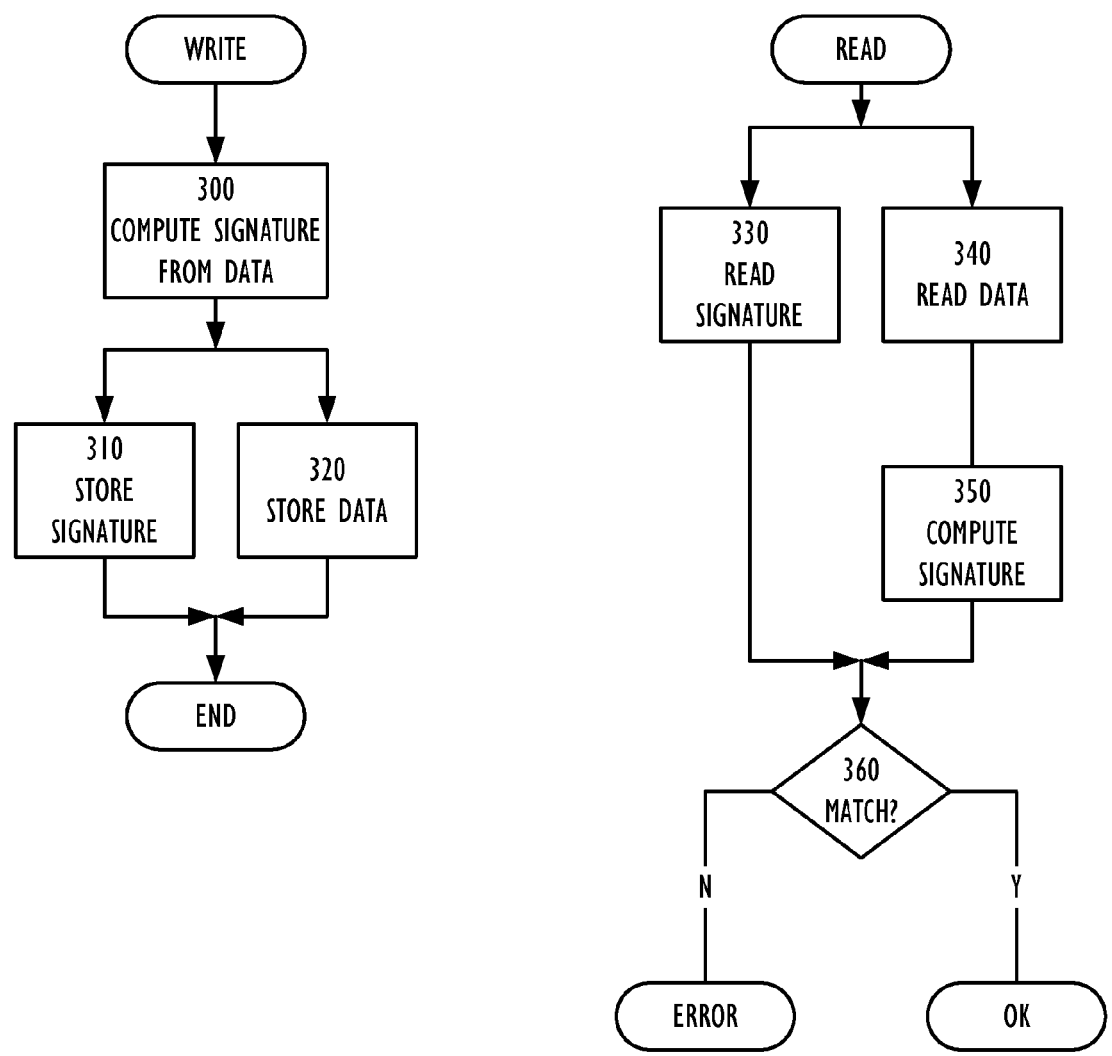
FIG. 3 is a pair of flowcharts illustrating writing and reading memory according to the embodiment of FIG. 2.

FIG. 3 is a pair of flowcharts illustrating reading and writing data according to the embodiment of FIG. 1. When writing data, in block 300 a signature is computed by signature logic 150 from the data. The signature in one embodiment is a Cyclic Redundancy Code (CRC) 10, generated by the polynomial generator of degree 10, $G(X)=X^{10}+X^9+X^5+X^4+X+1$, but any desired signature generation technique may be used, including non-CRC hashing functions and other types of signature generators.

Then in block 320, the data are stored at the designated address in memory 120, and in block 310, the memory 140 also stores the signature at the same address. The acts of blocks 310 and 320 may be performed in either order or concurrently as desired. Although as described herein, the same address is used on address lines 105, 125 for both memories 120, 140, in other embodiments, additional logic may compute a different address to read and write memory 140 using address line 125, based on the address transmitted on address line 105 to memory 120.

When reading data from memory 120, the core logic 110 in block 330 reads the signature from memory 140, and in block 340 reads the data from memory 120. As when writing data, blocks 330 and 340 may be performed in either order or concurrently as desired. The signature logic 160 then in block 350 recomputes the signature from the data received from memory 120. Then in block 360, the signature computed by signature logic 160 is compared with the signature read from memory 140 in block 330. If the signatures match, then the data have been written and read successfully. If the signatures do not match, then an error condition exists, and the core logic 110 may indicate an error indication, including taking any desired error action.

Figure 4:
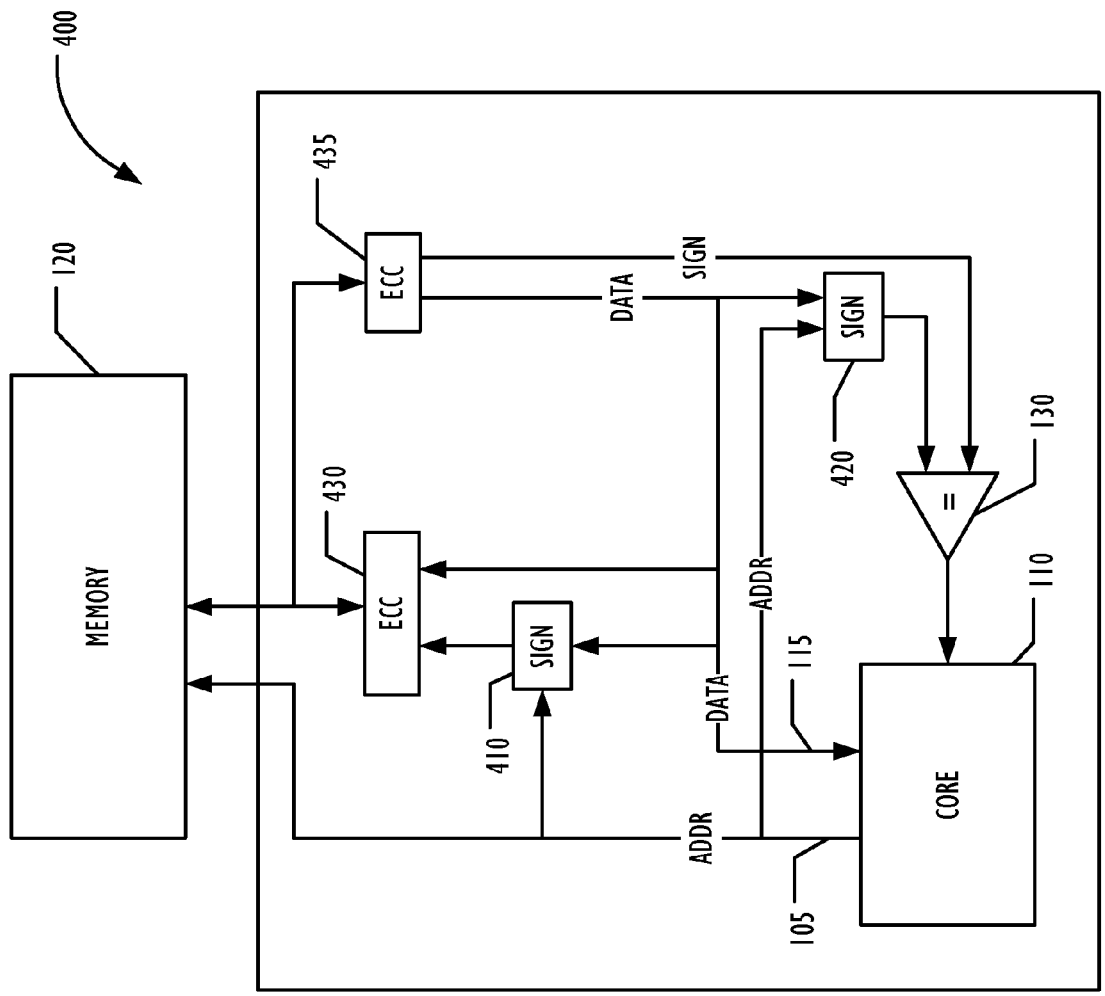
FIG. 4 is a block diagram illustrating a circuit according to one embodiment.

FIG. 4 illustrates another embodiment of a programmable device 400, which uses only one of the memories 120, 140, illustrated here as memory 120. When data are written to the memory 120, the signature, instead of being written to a different memory 140, is written to the memory 120. The signature may be written either before or after the data as desired, with the combined data and signature written in this example beginning at address addr1. Unlike the previous embodiment, in which the signature is computed on the data only, the signature in the embodiment of FIG. 4 is computed on a combination of the data and the address. As with FIG. 1 additional conventional elements such as buffers have been omitted from the drawing for clarity. Although in FIG. 4 the memory 120 is illustrated as external to the programmable device 400, the memory 120 may be internal to the programmable device 400 and implemented on-chip as desired.

When core logic 110 writes data to memory 120, the address is placed on address lines 105 and the data on data lines 115, as it is in the embodiment illustrated in FIG. 1. But in this embodiment, the signature generation logic 410 computes a signature based on both the address and data. An ECC generation logic 430 then generates an ECC from the data and the signature, passing the data and signature on to the memory 120, where both data and signature are written to the memory 120 at the address specified on the address line 105.

When core logic 110 reads data from memory 120, the address is once again placed on the address lines 105. The data and signature at that address are returned to ECC logic checking logic 435, which checks the ECC and performs any ECC-based data correction as needed. The data are then transmitted to the core logic 110 as well as signature logic 420, which computes a signature based on the data returned from memory 120 and the address on the address lines 105. The signature read from the memory is compared with the signature generated by the signature generation logic 420 by comparator 130, which passes the result on to the core logic 110. If the signatures do not match, then core logic may take any desired error action responsive to the error indication returned by the comparator 130. If either the data or address are corrupted when the data are written or read from memory 120, then this embodiment will detect the corruption.

Although ECC logics 430 and 435 are employed in FIG. 4 for conventional ECC purposes, ECC logics 430 and 435 may be omitted if desired.

Figure 5:
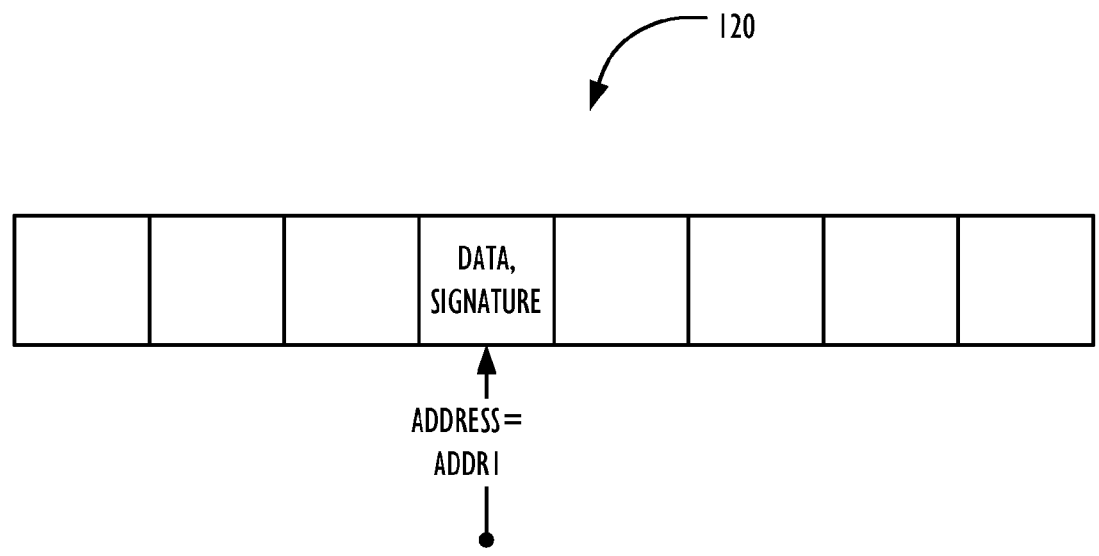
FIG. 5 is a block diagram illustrating a memory according to another embodiment.

FIG. 5 is a block diagram illustrating the data and signature written according to the embodiment of FIG. 4, where the address is indicated as addr1.

Figure 6:
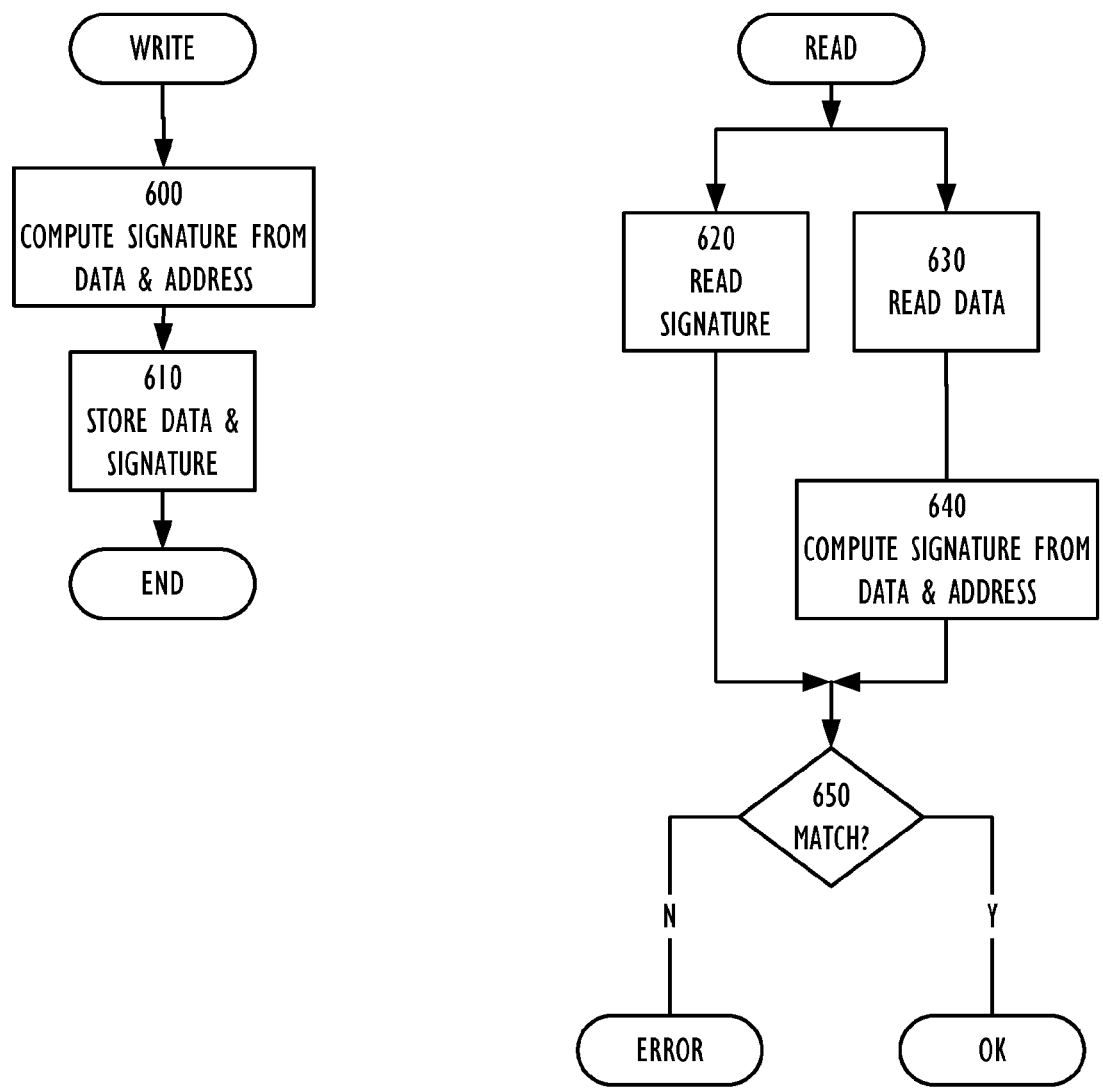
FIG. 6 is a pair of flowcharts illustrating writing and reading memory according to the embodiment of FIG. 4.

FIG. 6 is a pair of flowcharts illustrating writing and reading the memory 120 according to the embodiment of FIG. 4.

When writing data, in block 600, the signature logic 410 computes the signature of a combination of the data and the address to which the data are to be written. Any desired technique for combining the data and address for purposes of computing the signature may be used. As with the embodiment of FIGS. 1-3, any desired signature computation technique can be used, including CRC-10. Then the data and the signature are written in block 510 to memory 120 at the address specified on the address lines 105.

When reading data from memory 120, in block 620 the signature portion of the information stored in block 610 is read from the memory 120. In block 630 the data portion is read. Blocks 620 and 630 may be performed in either order or concurrently. Then in block 640, the signature logic 420 computes a signature from the received data and the address from which it was read, such as the address addr1 of FIG. 5. The signature portion read in block 620 is compared by the comparator 130 with the signature computed in block 640. If the signatures match, then the data was written and read successfully; otherwise, the data was incorrectly written or read, perhaps because of an address corruption, and the comparator indicates an error condition to core logic 110, which may take any desired error action as a result.

In one embodiment, the programmable device 400 may be implemented as part of a secure logic, packaged in a tamper-resistant packaging, for an encryption device such as an encryption switch for a Storage Area Network (SAN). But the programmable device 400 may be any programmable device that reads or writes to an addressable memory.

By using the techniques and elements disclosed above, the programmable devices 100 and 400 may detect and protect against both address and data corruption events when accessing a memory, instead of only data corruption events as in a conventional device that uses only ECC or other similar techniques. Such corruption may arise either during the time the data are stored in the memory 120, or because of corruption on the address lines 105 or data lines 115 while writing or reading the data to the memory 120.

Various changes in the details of the illustrated operational methods are possible without departing from the scope of the following claims. For instance, illustrative flowchart steps or process steps of FIGS. 3 and 6 may perform the identified steps in an order different from that disclosed here. Alternatively, some embodiments may combine the activities described herein as being separate steps. Similarly, one or more of the described steps may be omitted, depending upon the specific operational environment in which the method is being implemented.

In addition, any or all of the logic of FIGS. 1 and 4, including the memories 120, 140 and the core logic 110, may be implemented with discrete logic elements or combined in a single chip, for example in an application specific integrated circuit ("ASIC") or a field programmable gate array ("FPGA"). The specific circuit and logic elements illustrated in FIGS. 1 and 4 are illustrative and by way of example only, and other circuit and logic elements, and arrangements thereof may be used as desired, including combining elements illustrated as separate, or separating individual elements into multiple elements.

While certain exemplary embodiments have been described in details and shown in the accompanying drawings, it is to be understood that such embodiments are merely illustrative of and not devised without departing from the basic scope thereof, which is determined by the claims that follow.

We claim:

1. A device, comprising:
 a first memory;
 a second memory;
 a core logic unit, coupled to the first memory via a first address line and coupled to the second memory via a second address line, wherein the core logic unit is programmed to read from and write to the first and second memories;
 a first signature generator logic, configured to compute a first signature from data written to the first memory, coupled to the second memory to store the first signature in the second memory;
 a second signature generator logic, configured to compute a second signature from data read from the first memory; and
 a comparator logic, coupled to the second memory and the second signature generator logic, indicating an error condition to the core logic unit if the first signature does not match the second signature
 wherein the first signature is computed as part of writing to the first memory.

2. The device of claim 1, wherein the second memory, the core logic, the first signature generator logic, the second signature generator logic, and the comparator logic are contained in a single chip.

3. The device of claim 1, wherein the first memory, the second memory, the core logic, the first signature generator logic, the second signature generator logic, and the comparator logic are contained in a single chip.

4. The device of claim 1, wherein the first memory and the second memory are external to a chip containing the core logic, the first and second signature generator logics, and the comparator logic.

5. The device of claim 1, wherein the data are stored in the first memory at an address indicated on the first address line, and the first signature is stored in the second memory at the same address, indicated on the second address line.

6. The device of claim 1, wherein the data are stored in the first memory and the first signature is stored in the second memory concurrently.

7. The device of claim 1, further comprising:
 an error detection and correction logic coupled to the first memory,
 wherein the error detection and correction logic detects errors in data read from the first memory before the second signature logic computes the second signature.

8. A method, comprising:
 comparing a first signature computed from data written to a first memory using a first address line with a second signature computed from data read from the first memory; and
 storing the first signature in a second memory using a second address line,
 wherein the first signature is computed as part of writing to the first memory.

9. The method of claim 8, wherein comparing a first signature computed from data written to a first memory using a first address line with a second signature computed from data read from the first memory comprises:
 computing the first signature from the data;

writing the data to the first memory at a first address;
reading the data from the first memory at the first address;
reading the first signature from the second memory at a second address; and
computing the second signature from the data as read from the first memory.

10. The method of claim 9, wherein the act of writing the data to the first memory and the act of storing the first signature are performed concurrently.

11. The method of claim 9, wherein the act of reading the data from the first memory and the act of reading the first signature from the second memory are performed concurrently.

12. The method of claim 8, further comprising indicating an error condition if the first signature and the second signature do not match.

13. The method of claim 8, further comprising:
detecting and correcting data errors for data read from the first memory responsive to an error detection and correction code stored with the data in the first memory.

14. The method of claim 8, wherein the first memory is external to a chip containing logic for performing the act of comparing a first signature computed from data written to a first memory with a second signature computed from data read from the first memory and the act of storing the first signature in a second memory.

15. The method of claim 8, wherein the second memory is internal to a chip containing logic for performing the act of comparing a first signature computed from data written to a first memory with a second signature computed from data read from the first memory and the act of storing the first signature in a second memory.

16. The method of claim 8, wherein the first signature and the second signature are cyclic redundancy codes using a tenth order polynomial.

17. The method of claim 8, wherein the data are written to the first memory at a first address and the first signature is written to the second memory at the first address.

18. A device comprising:
a first memory; and
a field programmable gate array (FPGA), coupled to the first memory using a first address line, the FPGA comprising:
a second memory, internal to the FPGA, addressed using a second address line; and
logic to perform the acts of:
comparing a first signature computed from data written to the first memory with a second signature computed from data read from the first memory; and
storing the first signature in the second memory,
wherein the first signature is computed as part of writing to the first memory.

19. The device of claim 18, wherein the act of comparing comprises:
computing the first signature from the data;
writing the data to the first memory at a first address;
reading the data from the first memory at the first address;
reading the first signature from the second memory at the first address;
computing the second signature from the data as read from the first memory; and
generating an error indication if the first signature does not match the second signature.

* * * * *